United States Patent [19]

Kotani et al.

[11] Patent Number: 5,298,793
[45] Date of Patent: Mar. 29, 1994

[54] SEMICONDUCTOR DEVICE INCLUDING AN ELECTRODE

[75] Inventors: Jutaro Kotani; Masahiro Ihara, both of Takatsuki; Hideaki Nakura, Hirakata; Masami Yokozawa, Yawata, all of Japan

[73] Assignee: Matsushita Electronics Corporation, Osaka, Japan

[21] Appl. No.: 929,472

[22] Filed: Aug. 13, 1992

Related U.S. Application Data

[63] Continuation of Ser. No. 647,508, Jan. 29, 1991, abandoned.

[30] Foreign Application Priority Data

Feb. 8, 1990 [JP] Japan .................................. 2-29029

[51] Int. Cl.[5] ...................... H01L 23/48; H01L 29/44
[52] U.S. Cl. .................................. 257/765; 257/766; 257/771; 257/784
[58] Field of Search ............................ 357/65, 67, 71; 257/745, 765, 766, 771, 784

[56] References Cited

U.S. PATENT DOCUMENTS

| | | | |
|---|---|---|---|
| 3,662,454 | 5/1972 | Miller | 257/784 |
| 3,781,596 | 12/1973 | Galli et al. | 257/766 |
| 3,877,062 | 4/1975 | Murrmann | 357/67 |
| 4,042,954 | 8/1977 | Harris | 357/71 |
| 4,060,828 | 11/1977 | Satonaka | 257/784 |
| 4,141,020 | 2/1979 | Howard et al. | 357/15 |
| 4,151,545 | 4/1979 | Schnepf et al. | 257/784 |
| 4,176,443 | 12/1979 | Iannuzzi et al. | 257/766 |
| 4,372,809 | 2/1983 | Grewal et al. | 156/656 |
| 4,561,009 | 12/1985 | Yonezawa et al. | 257/766 |
| 4,728,534 | 3/1988 | Ho et al. | 257/766 |
| 4,922,322 | 5/1990 | Mathew | 357/69 |
| 5,023,698 | 6/1991 | Kobayashi et al. | 257/771 |

*Primary Examiner*—Rolf Hille
*Assistant Examiner*—David Ostrowski
*Attorney, Agent, or Firm*—Ratner & Prestia

[57] ABSTRACT

There is disclosed a semiconductor device having an electrode for wire bonding, comprising a first aluminum layer, a nickel-aluminum alloy layer, and a second aluminum layer. The electrode is suitable for bonding with copper wire, since the electrode withstands a wide range of bonding conditions—mechanical pressure, ultrasonic wave power and such, and permits a reliable electrical connection to be maintained.

7 Claims, 1 Drawing Sheet

SEMICONDUCTOR DEVICE INCLUDING AN ELECTRODE

This application is a continuation of application Ser. No. 07/647,508, filed Jan. 29, 1991, now abandoned.

BACKGROUND OF THE INVENTION

This invention relates to a semiconductor device and more specifically to an electrode on the semiconductor chip for connecting a semiconductor element thereon with an outside lead by means of a thin bonding wire.

A semiconductor device comprising a semiconductor chip and lead frame is well known. A semiconductor chip having one or more semiconductor elements such as diodes or transistors is mounted on a mounting area of a lead frame, and each region of the element such as the emitter, base or collector is connected with a lead of the lead frame by a thin bonding wire of gold or aluminum. For connection with the bonding wire each region of the semiconductor device is provided with an electrode. In an integrated circuit chip, regions are usually connected to each other by interconnection on the chip and, for connection with a lead outside, a special part of the interconnection called a bond pad or electrode is prepared. The bonding wire is connected with the electrode or the bond pad by means of thermocompression or thermosonic bonding. In carrying out this bonding, a small ball is formed at the end of a bonding wire by passing a $H_2$ torch over the end of the wire or by capacitance discharge. Then the ball is pressed onto the electrode under high temperature while the wire is excited ultrasonically.

As material of the bonding wire, copper is preferred rather than gold or aluminum, since gold is expensive and with aluminum it is difficult to make the ball, thus requiring a wide area of the substrate.

In the course of developing copper wire application to a semiconductor chip with conventional aluminum electrodes, however, two kinds of failure have been experienced. One type of failure is disconnection of the copper ball from the aluminum layer of the electrode due to insufficient pressure or temperature. The other type of failure is the destruction of the semiconductor substrate under the electrode. Bonding depends upon various conditions—mechanical pressure, temperature, strength of the ultrasonic wave, time, etc. As copper is rather hard, to make the ball at the end of the wire flat for bonding requires much pressure, and this frequently brings about the destruction of the substrate. Thus connecting a copper wire to an aluminum electrode can only be accomplished under very limited conditions, and small fluctuations of pressure, temperature or such often lead to detrimental failure.

It is the object of the present invention to provide a semiconductor device having a reliable connection with a lead outside the chip. It is another object of the invention to provide an electrode of a semiconductor chip which is suitable and easy for bonding with copper wire.

It is still another object of the invention to provide a method of manufacturing such electrodes.

BRIEF DESCRIPTION OF THE INVENTION

In carrying out the above and other objects of the present invention, the semiconductor device according to the invention includes a semiconductor substrate and an electrode wherein the electrode comprises a first aluminum layer, an aluminum-nickel alloy layer, and a second aluminum layer.

The chip of the semiconductor device according to the present invention is connected electrically with an outside lead by a copper bonding wire bonded at the electrode.

Further, the semiconductor device is manufactured according to the invention by depositing in vacuo the first aluminum layer, a nickel layer, and the second aluminum layer on the semiconductor substrate and heating the substrate in an inert atmosphere to change the nickel layer to a nickel-aluminum alloy layer.

DETAILED DESCRIPTION OF THE INVENTION

Figure 1:
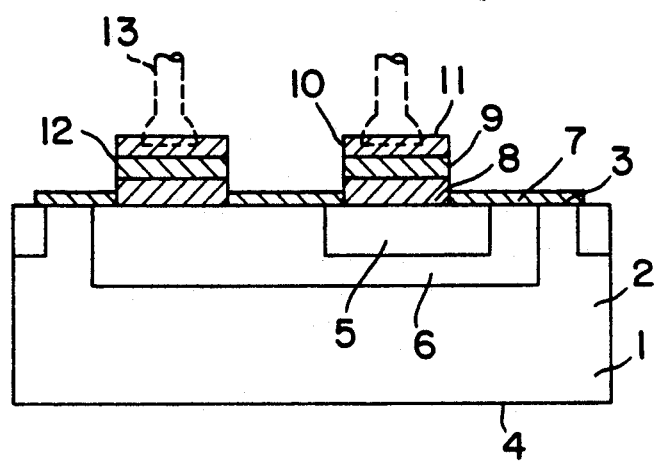
FIG. 1 illustrates the vertical cross section of a semiconductor device according to the invention.

FIG. 1, shows a vertical section of semiconductor device 1 of the invention.

For the semiconductor device 1 of this invention, a substrate 2 of silicon is provided, having upper surface 3 and under surface 4. The substrate 2 includes thereon emitter region 5 adherent to the upper surface 3, and also base region 6 surrounding the emitter region 5, both usually formed by a diffusion process. Surface 3 of the substrate 1 is covered by insulation layer 7 of $SiO_2$, which is formed while the emitter 5 or base 6 is being formed.

In order to provide semiconductor device 1 with an electrode, $SiO_2$ layer 7 is removed to make windows on top of the emitter region 5 and base region 6. By repeating vacuum deposition, the substrate 2 is covered all over with first aluminum layer s, nickel layer 9, and second aluminum layer 10, the thickness of the layers being 3, 0.5 and 2 micrometers respectively. The excess of the three layers is removed by photoetching leaving the emitter electrode 11 and base electrode 12 upon the emitter 5 and base region 6. Then the substrate 2 is heated 30 minutes to 500° C. in a nitrogen atmosphere to change the nickel layer 9 to a nickel-aluminum alloy layer 9 by solid state reaction. The nickel-aluminum alloy is $Al_3Ni$, as indicated by X-ray analysis.

The first aluminum layer 8 is preferably 1–4 microns thick, the nickel layer 9 is preferably 0.2–0.7 microns, and the second aluminum layer 10 is preferably 1–3 microns; and the temperature for the treatment must be within the range of 450°–550° C. An excessively thick aluminum layer s not only requires a long time for vacuum deposition, but lowers the precision of the photoetching process. If nickel layer 9 is too thick all the aluminum layers are consumed in changing nickel to $Al_3Ni$, and direct contact of $Al_3Ni$ layer 9 with the substrate 2 results. This causes increased contact resistance and decreased mechanical strength.

The electrodes 11 and 12 thus prepared in accordance with the invention have desirable properties. The first aluminum layer s on the semiconductor substrate 2 lowers the contact resistance, and, in cooperation with $Al_3Ni$ layer 9 on it, mitigates the excessive pressure onto the substrate 2 while the substrate 2 is under the bonding operation, and prevents destruction of the semiconductor substrate 2. The second aluminum layer 10 produces an aluminum-copper alloy, which can maintain a good electrical connection, with copper boding wire 13.

Figure 2:
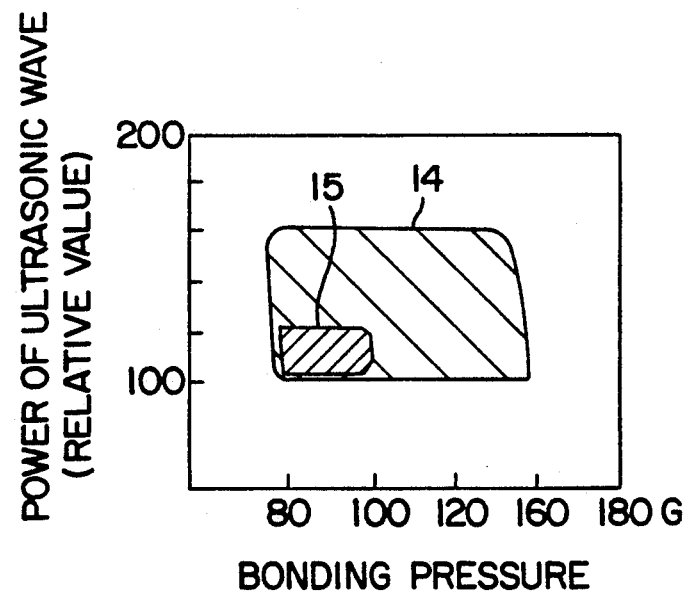
FIG. 2 shows the useful range of applicable mechanical pressure and ultrasonic power at the bonding operation of copper wire in accordance with the present invention.

FIG. 2 shows the useful ranges of mechanical pressure (abscissa) and ultrasonic power (relative value-ordinate) for the electrode of the invention 14 and a conventional aluminum electrode 15 Outside the range shown, disconnection or destruction occurred frequently. It is observed, the electrode according to the invention has utility range 14 wider than range 15 of the conventional aluminum electrode.

What is claimed:

1. A semiconductor device comprising a semiconductor substrate and an electrode, which electrode comprises a first aluminum layer, an aluminum-nickel alloy layer, and a second aluminum layer, wherein said aluminum-nickel alloy layer is interposed between said first and second aluminum layers, said device further including a copper wire electrically bonded to said electrode, wherein said semiconductor substrate is connected electrically to said copper wire.

2. A semiconductor device according to claim 1, wherein the aluminum-nickel alloy is $Al_3Ni$.

3. A semiconductor device according to claim 1, wherein said first aluminum layer is on said semiconductor substrate.

4. A semiconductor device according to claim 1, wherein said copper wire is electrically bonded to said second aluminum layer.

5. A semiconductor device according to claim 1, wherein said aluminum-nickel alloy layer has a thickness of 0.2–0.7 microns.

6. A semiconductor device according to claim 5, wherein said first aluminum layer has a thickness of 1–4 microns.

7. A semiconductor device according to claim 6, wherein said second aluminum layer has a thickness of 1–3 microns.

* * * * *